United States Patent
Wang

(10) Patent No.: US 9,786,798 B2
(45) Date of Patent: Oct. 10, 2017

(54) CONNECTION BOX

(71) Applicant: Tyco Electronics (Shanghai) Co. Ltd., Shanghai (CN)

(72) Inventor: Shuzhi Wang, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 503 days.

(21) Appl. No.: 14/332,855

(22) Filed: Jul. 16, 2014

(65) Prior Publication Data

US 2015/0021088 A1    Jan. 22, 2015

(30) Foreign Application Priority Data

Jul. 16, 2013    (CN) .................... 2013 2 0422428 U

(51) Int. Cl.
*H01L 31/02*    (2006.01)
*H02S 40/34*    (2014.01)

(52) U.S. Cl.
CPC .......... *H01L 31/0201* (2013.01); *H02S 40/34* (2014.12)

(58) Field of Classification Search
CPC ............ H05K 5/00; H02S 40/34; H01R 33/00
USPC ................... 174/551, 564; 439/76.1
See application file for complete search history.

(56) References Cited

U.S. PATENT DOCUMENTS

| | | | |
|---|---|---|---|
| 6,344,612 B1* | 2/2002 | Kuwahara | H01L 31/048 174/50 |
| 7,824,189 B1* | 11/2010 | Lauermann | H02S 40/34 136/246 |
| 8,097,818 B2* | 1/2012 | Gerull | H02S 40/34 174/564 |
| 2006/0289053 A1* | 12/2006 | Nieleck | H02S 40/34 136/244 |
| 2010/0012343 A1* | 1/2010 | Ji | H02S 40/34 174/50.52 |

* cited by examiner

*Primary Examiner* — William H Mayo, III
*Assistant Examiner* — Krystal Robinson
(74) *Attorney, Agent, or Firm* — Barley Snyder

(57) ABSTRACT

A connection box for a photovoltaic module is provided and includes a housing, a diode, and a pair of connection terminals. The pair of connection terminals are electrically connected to each other through the diode, and each of the pair of connection terminals includes a base, first connection portion, and a second connection portion. The base is mounted on the housing. The first connection portion includes a first end integrally connected with the base and a first connection region connectable with the diode. The second connection portion includes a connection end electrically connected with the base and having a second connection region connectable with a bus bar.

17 Claims, 5 Drawing Sheets

CONNECTION BOX

CROSS-REFERENCE TO RELATED APPLICATION

This application claims the benefit of the filing date under 35 U.S.C. §119(a)-(d) of Chinese Patent Application No. 2013204224286 filed on Jul. 16, 2013.

FIELD OF THE INVENTION

The invention relates to a connection box and, more particularly, to a connection box for a photovoltaic module.

BACKGROUND

It is sometimes necessary to transmit weak electrical signals to an electrical device disposed inside a connection box through a bus bar for a solar energy photovoltaic module or a communication module. The weak electrical signals converge and then are retransmitted to an external electronic apparatus, for example, a photovoltaic current collector, through an external cable. Generally, a plurality of connection terminals and a diode are provided to connect the bus bar and the external cable. There are two known connection types for the connection terminals and the diode arrangement.

In one of the connection types, two connection terminals are arranged parallel to each other, and the diode is connected between the two connection terminals. With this configuration, distance is provided between a soldering point of the bus bar and pins of the diode. Thereby, any heat generated during soldering is unlikely transferred to the pins of the diode, and the diode is unlikely damaged. However, with this configuration, the two connection terminals connecting both ends of the diode are arrange parallel to each other, and therefore, size of the connection box is increased along a width. As a result, such a design limits application of a larger connection box, for example, causing this connection box unsuitable for an assembly with a serious appearance requirement or a bifacial assembly.

In the other of the two connection types, two connection terminals and the diode are arranged along a length of the connection box, thereby reducing the width the body of the connection box, but increasing the length the connection box. Furthermore, this type of connection box cannot satisfy UL safety specifications, increasing the operation difficulty.

SUMMARY

The invention has been made to overcome or alleviate at least one aspect of the above mentioned disadvantages. Accordingly, a connection box for a photovoltaic module is provided and includes a housing, a diode, and a pair of connection terminals. The pair of connection terminals are electrically connected to each other through the diode, and each of the pair of connection terminals includes a base, first connection portion, and a second connection portion. The base is mounted on the housing. The first connection portion includes a first end integrally connected with the base and a first connection region connectable with the diode. The second connection portion includes a connection end electrically connected with the base and having a second connection region connectable with a bus bar.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
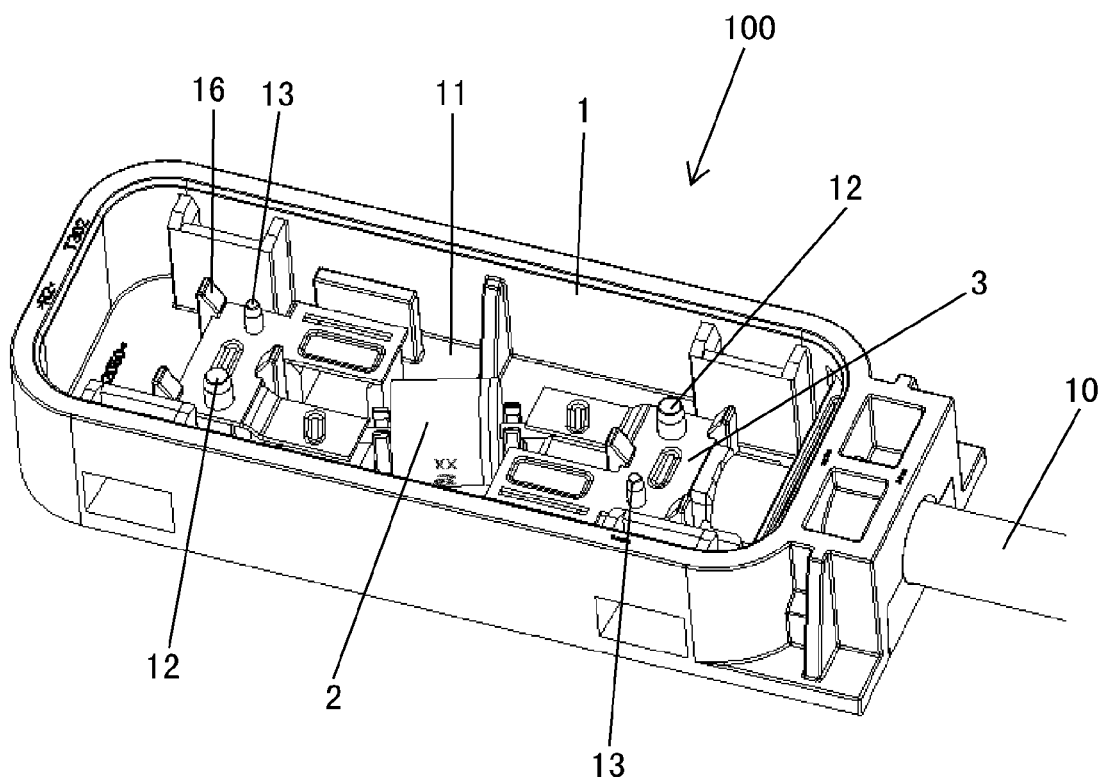
FIG. 1 is a perspective view a connection box according to the invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Now with reference to the drawings, a connection box for a photovoltaic module is provided with a housing; at least one diode; and at least one pair of connection terminals, wherein the diode is connected between one respective pair of connection terminals. Each connection terminal includes a base mounted on the housing, a first connection portion integrally connected with the base and provided with a first connection region and a second connection portion.

The connection box according to the invention is discussed according to various exemplary embodiments in order to electrically connect a bus bar of an electronic system, such as, a photovoltaic module, for generating or transmitting weak electrical signals, so as to converge the weak electrical signals and retransmit the converged weak electrical signals to an external electronic apparatus, such as, a photovoltaic current collector through an external cable 10.

Figure 2:
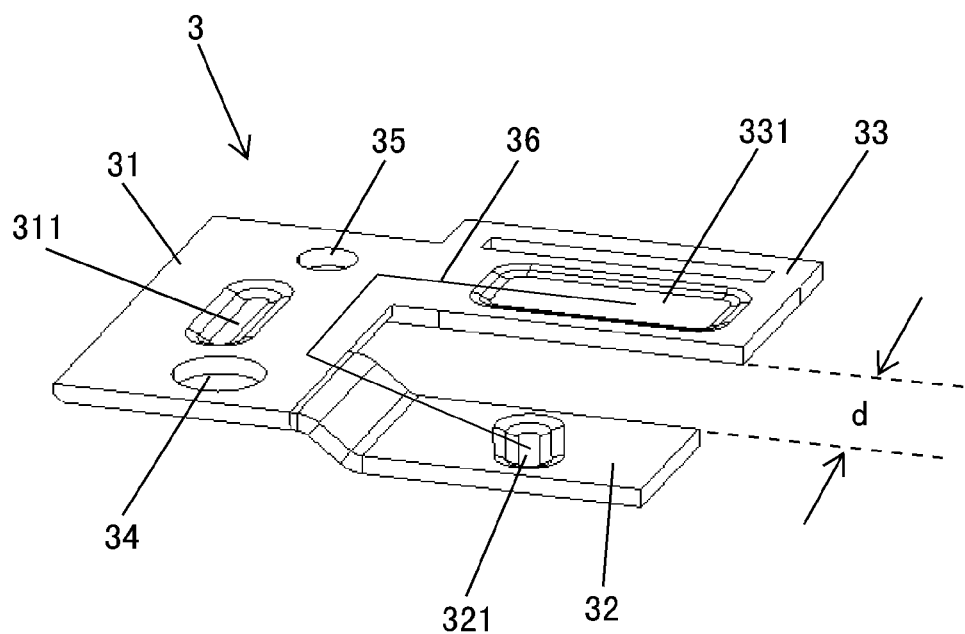
FIG. 2 is a perspective view of a connection terminal of the connection box of FIG. 1.

As shown in FIGS. 1-2, a connection box 100 is shown and includes a housing 1 made of insulation material, at least one diode 2, and at least one pair of connection terminals 3.

Each diode 2 is connected between one respective pair of connection terminals 3. Each connection terminal includes a base 31 made of a conductive metal sheet, a first connection portion 32 and a second connection portion 33. The base 31 is mounted on the housing 1. The first connection portion 32 is integrally connected with the base 31 and provided with a first connection region 321 for connecting with the diode 2. The second connection portion 33 is connected to the base 31 and provided with a second connection region 331 for connecting with a bus bar (not shown). A straight path between the first and second connection regions 321 and 331 is disconnected, such that a straight heat conduction path from the second connection region 331 to the first connection region 321 is removed. Thereby, any heat generated in the second connection region 331 cannot be transferred to the first connection region 321 by a straight path. Rather, any heat generated in the second connection region 331 may flow to the first connection region 321 through a bending heat conduction path.

Referring to FIG. 2, a first installation hole 34 and a second installation hole 35 are provided along the base 31 and arranged along a width thereof. Correspondingly, as shown in FIG. 1, a first installation post 12 and a second installation post 13 are formed on a bottom 11 of the housing 1 and configured to pass through the first installation hole 34 and the second installation hole 35, respectively. Also, a plurality of barbs 16 are formed on the bottom 11 of the housing 1 and configured to secure the base 31. During installation, the first and second installation holes align with the first and second installation posts 12, 13, respectively, and the corresponding barbs 16 abut the edge of the base 31 at the same time, then the base 31 is pushed downward, to deflect the barbs 16 outside. After the base 31 is installed in place, the barbs 16 restore to their original states and secure the entire connection terminal 3 in the housing 1.

As shown in FIG. 2, the first connection portion 32 and the second connection portion 33 extend substantially parallel to each other in a longitudinal direction (a length direction of the connection box) from the same side of the base 31. A gap d is defined between the first connection portion 32 and the second connection portion 33. Thereby, in a plan view, the first connection portion 32 and the second connection portion 33 exhibit a substantial U-shape. The first connection portion 32 and the second connection portion 33 are stepped, or configured along different planes. In an alternative exemplary embodiment, the first connection portion 32, the second connection portion 33 and the base 31 may be located in the same plane.

As shown in FIG. 1, the paired connection terminals 3 are positioned so that the first connection portion 32 of one of the paired connection terminals 3 is opposite to the second connection portion 33 of the other of the paired connection terminals 3. Accordingly, the first connection portions 32 and the second connection portions 33 are arranged diagonal, opposite to each other. In the shown embodiment, two pins of the diode 2 connect to the first connection regions 321, respectively, so that the diode 2 is arranged at an angle with respect to a length of the connection box 100.

A cable 10, for example connected to an external electronic apparatus, passes through a receiving passageway formed in the housing 1 and is electrically connected to a third connection region 311 on the base 31, for example, by soldering. A third connection region on the base 31 of the other of the pair of connection terminals 3 is left unused. A plurality of bus bar receiving passageways (not shown) are formed in the bottom 11 of the housing 1 and configured to permit bus bars (not shown) to pass there through. The bus bars, for example from photovoltaic modules, pass through the respective through holes and are soldered to the second connection regions on the second connection portions of the other of the pair of connection terminals. Accordingly, an electrical connection of the photovoltaic module to the external electronic apparatus can be achieved by use of the connection box of the invention. In an exemplary embodiment, the first connection region 321, the second connection region 331 and the third connection region 311 are formed with a recess feature.

In the connection box 100 shown, the straight heat conduction path from the second connection region 331 to the first connection region 321 and the first connection region 321 is removed. Thereby, the heat generated in the second connection region 331 cannot be directly conducted to the first connection region 321 through a straight path. During connecting the bus bar to the second connection region 331 by, for example, soldering, any heat generated in the second connection region 331 is transferred to the first connection region 321 along a substantially U-shaped bending heat conduction path 36. Therefore, the heat conduction path between the second connection region 331 and the first connection region 321 is extended, decreasing the heat conduction capability from the second connection region to the first connection region, and protecting the diode 2 from being damaged or failed due to the heat generated during soldering the bus bar.

Figure 3:
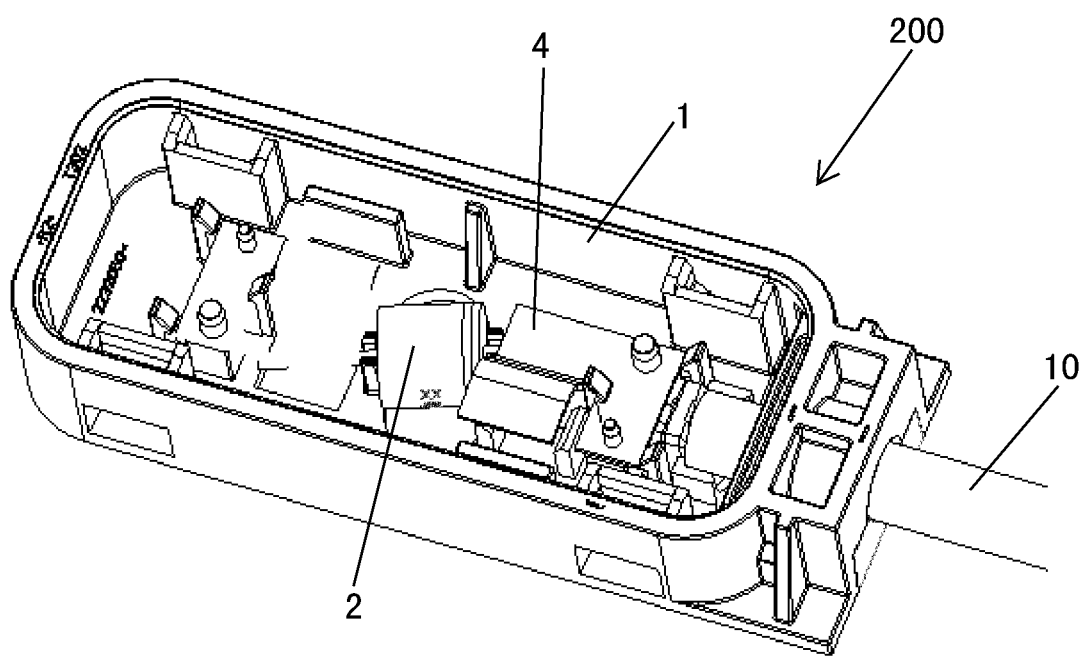
FIG. 3 is a perspective view of another connection box according to the invention.

Now with reference to FIG. 3, another connection box 200 according to the invention is shown and includes a connection terminal 4.

The housing 1 of the connection box 200 includes the same as the housing 1 of the connection box 100.

Figure 4:
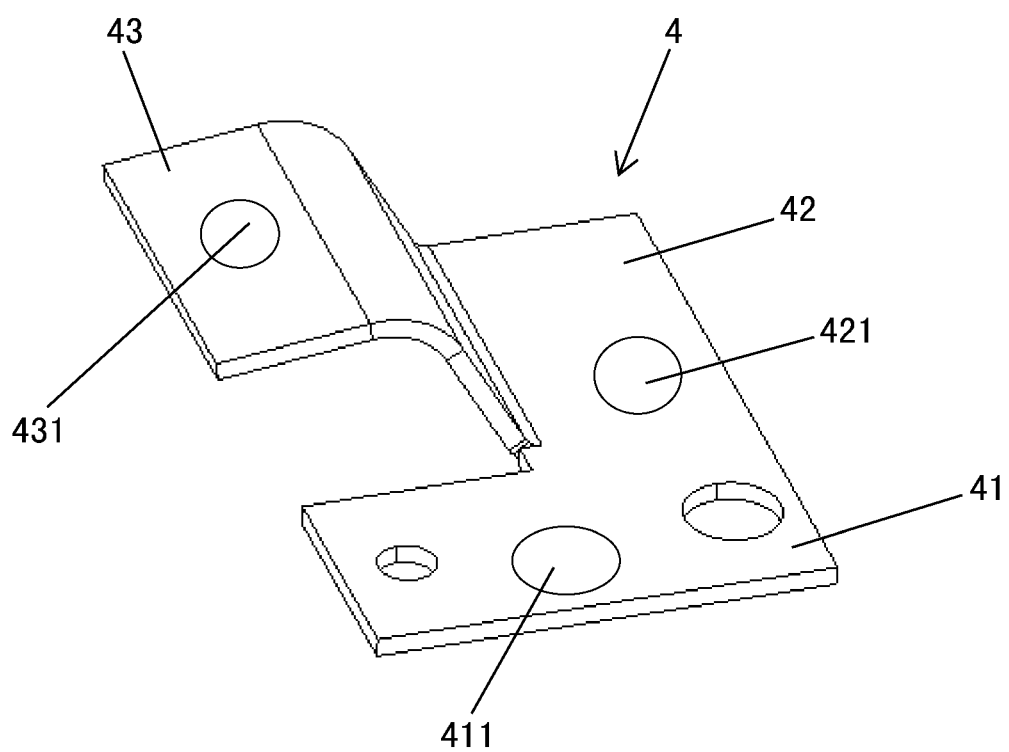
FIG. 4 is a perspective view of a connection terminal of the connection box of FIG. 3.

Referring to FIGS. 3-4, each connection terminal 4 includes a base 41 made of a conductive metal sheet, a first connection portion 42, and a second connection portion 43. The base 41 is mounted on the housing 1. The first connection portion 42 is integrally connected with the base 41 and provided with a first connection region 421 for connecting with a diode. The second connection portion 43 is electrically connected with the base 41 and provided with a second connection region 431 for connecting with a bus bar (not shown). A straight path between the first and second connection regions 421 and 431 is disconnected, such that a straight heat conduction path from the second connection region 431 to the first connection region 421 is removed. Thereby, any heat generated in the second connection region 431 cannot be conducted to the first connection region 421 along a straight path.

In the connection terminal 4, the first connection portion 42 extends from a side of the base 41 along a length of the connection box 200, and the second connection portion 43 is bent from a side of the first connection portion 42 and extends along a width thereof, away from the side of the first connection portion 42. The first connection portion 42 and the second connection portion 43 are stepped, such that they positioned along different planes. Thereby, in a plan view, the first connection portion 42 and the second connection portion 43 exhibit a substantial Z-shape. Two installation holes are disposed along the base 41. A cable 10, for example connected to an external electronic apparatus, passes through a through hole formed in the housing 1 and is electrically connected to a third connection region 411 on the base 41 of one of a pair of connection terminals 4 by, for example, soldering. A third connection region on the base 41 of the other of the pair of connection terminals 4 is left unused.

Figure 5:
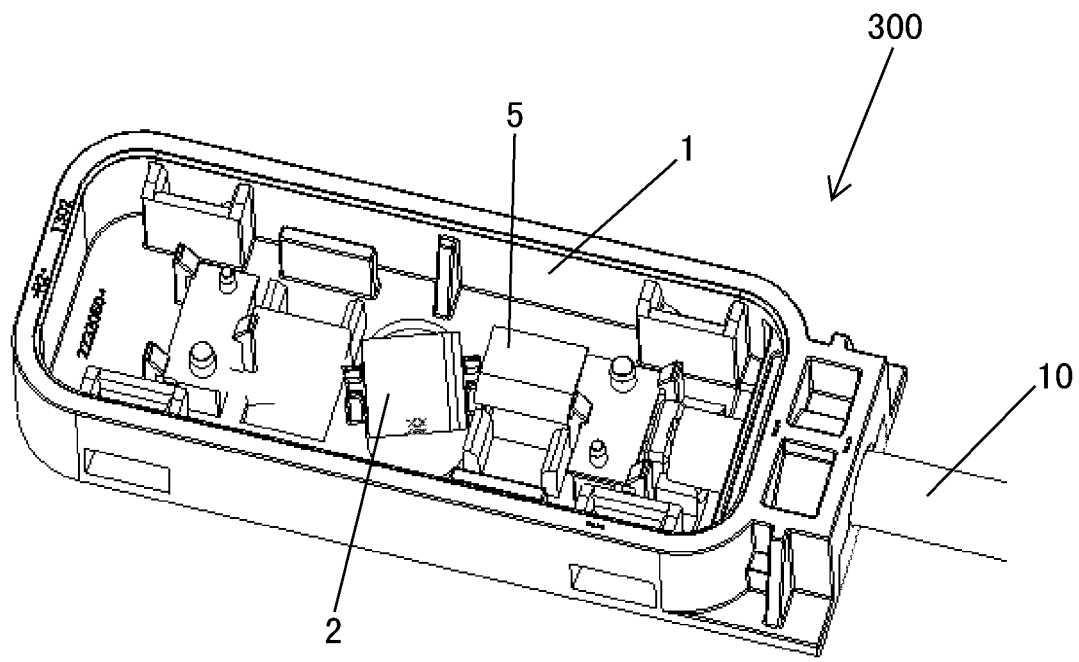
FIG. 5 is a perspective view another connection box according to the invention.
Figure 6:
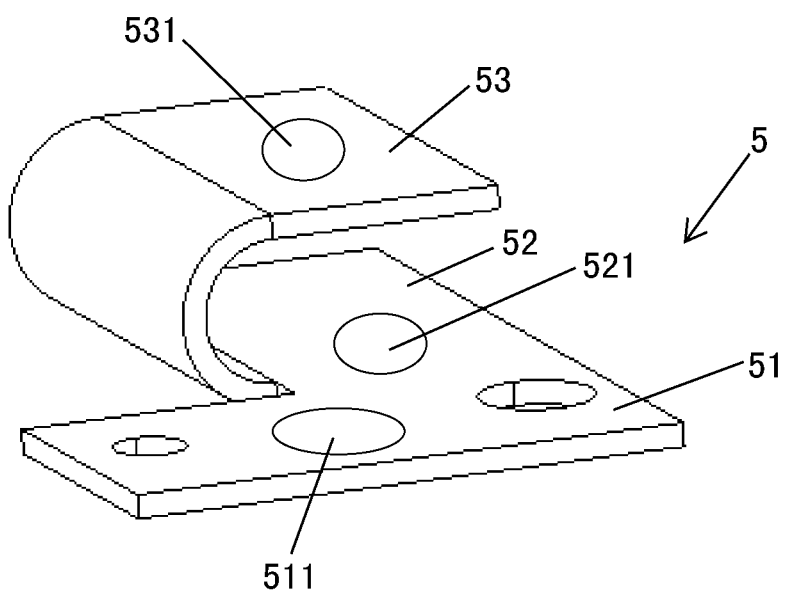
FIG. 6 is a perspective view of a connection terminal of the connection box of FIG. 5.

With respect to FIGS. 5 and 6, a connection box 300 according to the invention is shown, with a housing 1 configured to be the same as the housing 1 of the connection box 100.

The connection box 300 includes a connection terminal 5 having a base 51 made of a conductive metal sheet, a first connection portion 52 and a second connection portion 53. The base 51 is mounted on the housing 1. The first connection portion 52 is integrally connected with the base 51 and provided with a first connection region 521 for connecting with a diode. The second connection portion 53 is electrically connected with the base 51 and provided with a second connection region 531 for connecting with a bus bar (not shown). A straight path between the first and second connection regions 521 and 531 is disconnected, such that a straight heat conduction path from the second connection region 531 to the first connection region 521 is removed. Thereby, any heat generated in the second connection region 531 cannot be conducted to the first connection region 521 along a straight path.

In the connection terminal 5, the first connection portion 52 extends from a side of the base 51 along a length of the connection box 300, the second connection portion 53 is bent from a side of the first connection portion 52 and extends along a width thereof, approaching the first connection portion 52, and the first connection portion 52 and the second connection portion 53 are positioned along different planes. Thereby, in a side view, the first connection portion 52 and the second connection portion 53 exhibit a substantial U-shape. Two installation holes are formed in the base 51. A cable 10, for example connected to an external electronic apparatus, passes through a through hole formed in the housing 1 and is electrically connected to a third connection region 511 on the base 51 of one of a pair of connection terminals 5 by, for example, soldering. A third connection region on the base 51 of the other of the pair of connection terminals 5 is left unused.

Figure 7:
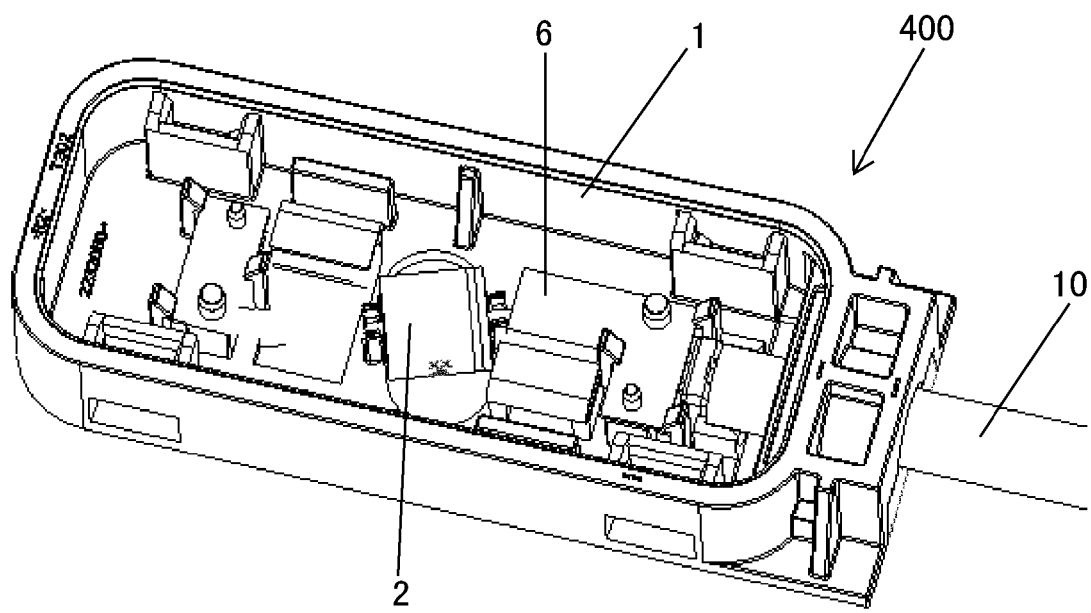
FIG. 7 is a perspective view of another connection box according to the invention.
Figure 8:
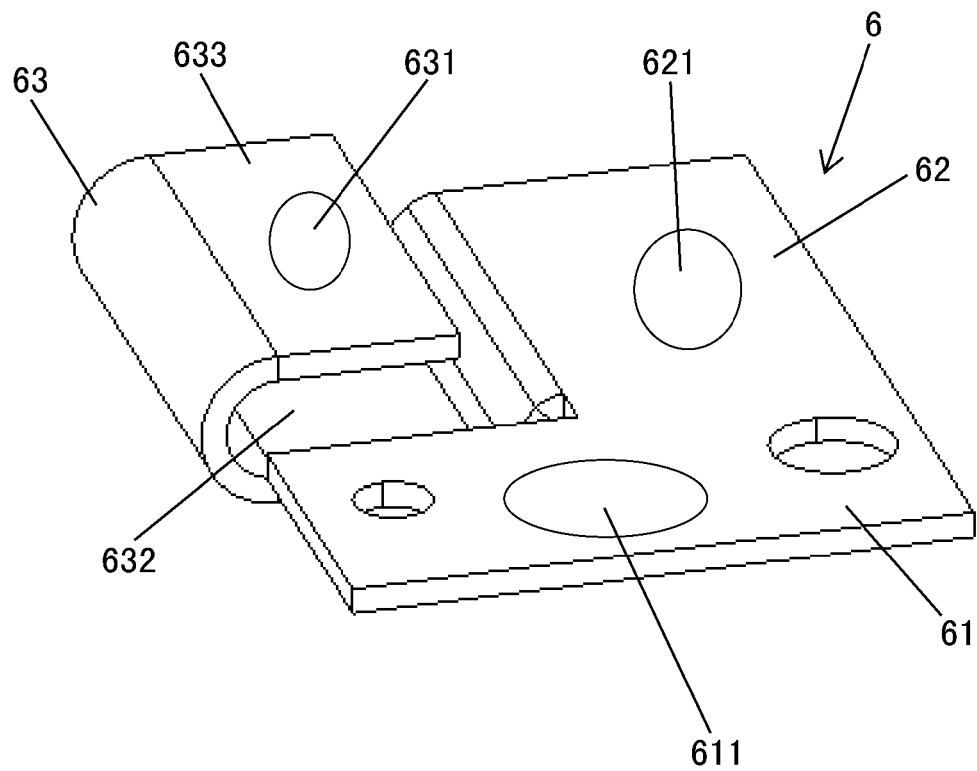
FIG. 8 is a perspective view of a connection terminal of the connection box of FIG. 7.

Referring to FIGS. 7-8, a connection box 400 according to the invention is shown and includes a connection terminal 6. The housing 1 of the connection box 400 is configured to be the same as the housing 1 of the connection box 100.

Each connection terminal 6 includes a base 61 made of a conductive metal sheet, a first connection portion 62, and a second connection portion 63. The base 61 is mounted on the housing 1. The first connection portion 62 is integrally connected with the base 61 and provided with a first connection region 621 for connecting with a diode. The second connection portion 63 is electrically connected with the base 61 and provided with a second connection region 631 for connecting with a bus bar (not shown). A straight path between the first and second connection regions 621 and 631 is disconnected, such that a straight heat conduction path from the second connection region 631 to the first connection region 621 is removed. Thereby, any heat generated in the second connection region 631 cannot be conducted to the first connection region 621 along a straight path.

In the connection terminal 6, the first connection portion 62 extends from a side of the base 61 along a length of the connection box 400. The second connection portion 63 is configured to have a substantial U-shape and includes a first arm 632 extending from a side of the first connection portion 62 along a width, away from the first connection portion 62 and a second arm 633 on which the second connection region 331 is formed. Thereby, in a side view, the first arm 632 and the second arm 633 of the second connection portion 63 exhibit a substantial U-shape. Two installation holes are formed in the base 61. A cable 10, for example connected to an external electronic apparatus, passes through a through hole formed in the housing 1 and is electrically connected to a third connection region 611 on the base 61 of one of a pair of connection terminals 6 by, for example, soldering. A third connection region on the base 61 of the other of the pair of connection terminals 6 is left unused.

Figure 9:
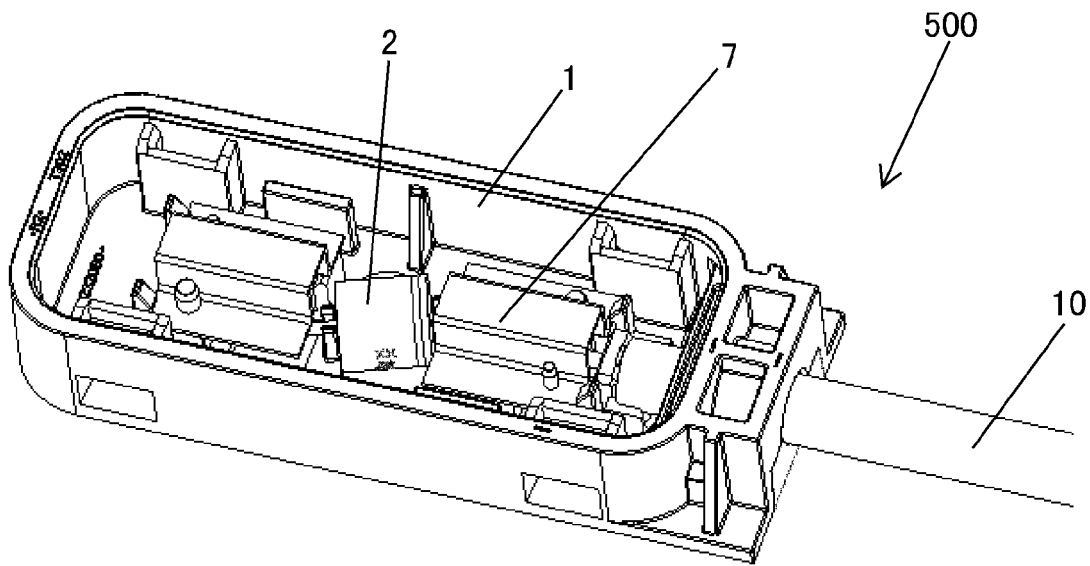
FIG. 9 is a perspective view another connection box according to the invention.
Figure 10:
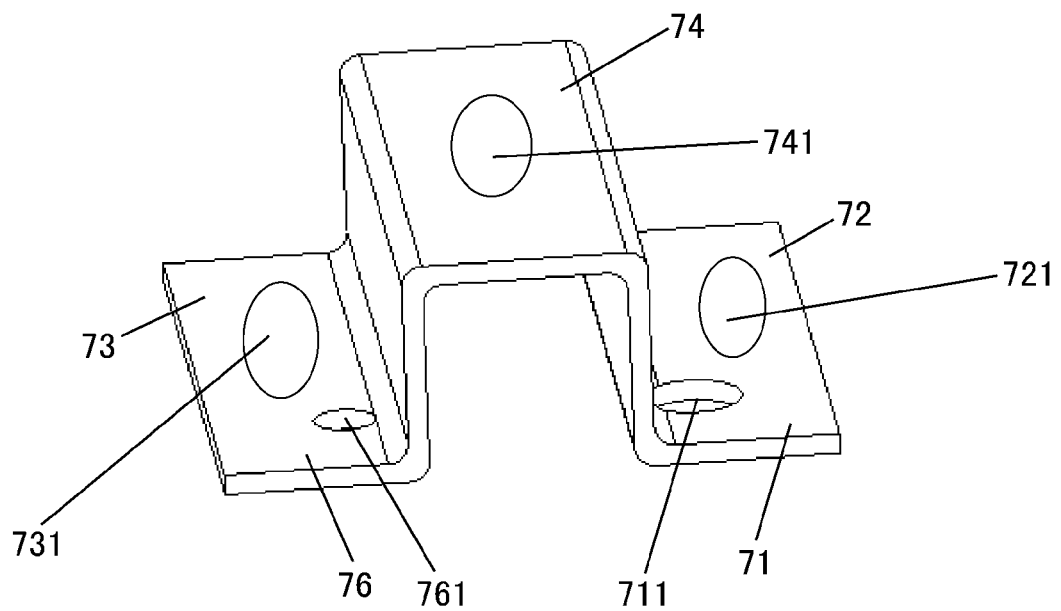
FIG. 10 is a perspective view of a connection terminal of the connection box of FIG. 7.

Referring to FIGS. 9-10, a connection box 500 according to the invention is shown and includes a connection terminal 7. The housing 1 of the connection box 500 is configured to be the same as the housing 1 of the connection box 100.

Referring to FIGS. 9-10, each connection terminal 7 includes a base having a first base 71 and a second base 76 and made of a conductive metal sheet, a first connection portion 72 and a second connection portion 73. The first base 71 and the second base 76 are mounted on the housing 1. The first connection portion 72 is integrally connected with the first base 71 and provided with a first connection region 721 for connecting with a diode. The second connection portion 73 is electrically connected with the second base 76 and provided with a second connection region 731 for connecting with a bus bar (not shown). A straight path between the first and second connection regions 721 and 731 is disconnected, such that a straight heat conduction path from the second connection region 731 to the first connection region 721 is removed. Thereby, any heat generated in the second connection region 731 cannot be conducted to the first connection region 721 along a straight path.

In the connection terminal 7, the base includes the first base 71 and the second base 76. The first connection portion 72 extends from a side of the first base 71 along a length of the connection box 500, and the second connection portion 73 extends from a side of the second base 76 in the longitudinal direction. A bent portion 74 is formed between the first and second connection portions 72 and 73. A first installation hole 711 is formed in the first base 71, and a second installation hole 761 is formed in the second base 76. A cable 10, for example connected to an external electronic apparatus, passes through a through hole formed in the housing 1 and is electrically connected to a third connection region 741 on the bent portion 74 of one of a pair of connection terminals 7 by, for example, soldering. A third connection region on the bent portion of the other of the pair of connection terminals 7 is leaved unused.

In the various exemplary embodiments of the invention, a connection box having limited size can be achieved. The connection terminal can be formed by cutting, bending and punching a single metal sheet. A straight heat conduction path from the second connection region to the first connection region is removed so that any heat generated in the second connection region cannot be conducted to the first connection region along a straight path. Thereby, any heat generated in the second connection region is conducted to the first connection region through the bending heat conduction path, extending the heat conduction path, decreasing the heat conduction capability from the second connection region to the first connection region, protecting the diode from being damaged or failed due to the heat during soldering the bus bar, achieving the miniaturized connection box, improving the performances of the electrical devices in the connection box, and keeping cost from being increased due to maintenance, rework and exchange of the electrical devices.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connection box for a photovoltaic module, comprising:
    a housing;
    a diode; and
    a pair of connection terminals electrically connected to each other through the diode, each of the pair of connection terminals having:
        a base mounted on the housing;
        a first connection portion disposed in a first plane and having a first end integrally connected with the base and a first connection region connectable with the diode; and
        a second connection portion disposed in a second plane different from and parallel to the first plane, the second connection portion having a connection end electrically connected with the base and a second connection region connectable with a bus bar.

2. The connection box according to claim 1, further comprising a first installation hole disposed along a lateral end of the base.

3. The connection box according to claim 2, further comprising a second installation hole disposed along an opposite lateral end of the base.

4. The connection box according to claim 1, wherein the first connection portion and the second connection portion extend from a side of the base.

5. The connection box according to claim 4, further comprising a gap located between the first connection portion and the second connection portion.

6. The connection box according to claim 1, wherein the first connection portion extends from a length side of the base and the second connection portion is bent from a side of the first connection portion.

7. The connection box according to claim 6, wherein the second connection portion extends away from the first connection portion.

8. The connection box according to claim 6, wherein the second connection portion is positioned above the first connection portion.

9. The connection box according to claim 6, wherein the second connection portion is U-shaped.

10. The connection box according to claim 9, wherein the second connection portion includes a first arm extending away from the first connection portion and a second arm on which the second connection region is positioned.

11. The connection box according to claim 1, wherein the housing includes a plurality of bus-bar receiving passageways formed along a bottom surface thereof.

12. The connection box according to claim 1, wherein the housing includes a first installation post extending from a bottom of the housing.

13. The connection box according to claim 12, wherein the housing further includes a second installation post extending from a bottom of the housing.

14. The connection box according to claim 13, wherein the housing further includes a plurality of barbs formed along a bottom thereof.

15. The connection box according to claim 1, wherein the housing further includes a plurality of barbs formed along a bottom thereof.

16. A connection box for a photovoltaic module, comprising:
    a housing;
    a diode; and
    a pair of connection terminals electrically connected to each other through the diode, each of the pair of connection terminals having:
        a base mounted on the housing and having a first base, a second base, and a bent portion disposed between the first base and the second base;
        a first connection portion extending from a side of the first base and having a first connection region connectable with the diode;
        a second connection portion extending from a side of the second base and having a second connection region connectable with a bus bar; and
        the bent portion having a third connection region connectable with a cable.

17. The connection box according to claim 16, further comprising a first installation hole disposed along the first base and a second installation hole disposed along the second base.

* * * * *